United States Patent
Park et al.

(10) Patent No.: US 8,592,869 B2
(45) Date of Patent: Nov. 26, 2013

(54) NITRIDE-BASED HETEROJUNCTION SEMICONDUCTOR DEVICE AND METHOD FOR THE SAME

(75) Inventors: Jinhong Park, Seoul (KR); Kwangchoong Kim, Seoul (KR); Taehoon Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/554,455

(22) Filed: Jul. 20, 2012

(65) Prior Publication Data

US 2013/0026450 A1 Jan. 31, 2013

(30) Foreign Application Priority Data

Jul. 25, 2011 (KR) .................. 10-2011-0073586

(51) Int. Cl.
*H01L 29/66* (2006.01)
*H01L 21/338* (2006.01)

(52) U.S. Cl.
USPC ............ 257/194; 257/E29.246; 257/E21.403; 438/172

(58) Field of Classification Search
None
See application file for complete search history.

(56) References Cited

U.S. PATENT DOCUMENTS

| 2004/0061129 A1* | 4/2004 | Saxler et al. .................. 257/192 |
| 2006/0019435 A1* | 1/2006 | Sheppard et al. ............. 438/167 |
| 2010/0068855 A1 | 3/2010 | Saxler et al. |

FOREIGN PATENT DOCUMENTS

KR 10-2007-0091629 A 9/2007

* cited by examiner

*Primary Examiner* — Michael Lebentritt
*Assistant Examiner* — Kevin Quinto
(74) *Attorney, Agent, or Firm* — McKenna Long & Aldridge, LLP

(57) ABSTRACT

Disclosed is a semiconductor device. More specifically, disclosed are a nitride-based heterojunction semiconductor device and a method for producing the same. The nitride-based heterojunction semiconductor device includes a nitride semiconductor buffer layer, a barrier layer disposed on the buffer layer, a cap layer discontinuously disposed on the barrier layer, a source electrode and a drain electrode that contact at least one of the barrier layer and the cap layer, and a gate electrode that Schottky-contacts at least one of the barrier layer and the cap layer and is disposed between the source electrode and the drain electrode.

22 Claims, 6 Drawing Sheets

NITRIDE-BASED HETEROJUNCTION SEMICONDUCTOR DEVICE AND METHOD FOR THE SAME

This application claims the benefit of Korean Patent Application No. 10-2011-0073586, filed on Jul. 25, 2011, which is hereby incorporated by reference as if fully set forth herein.

BACKGROUND OF THE DISCLOSURE

1. Field of the Disclosure

The present invention relates to a semiconductor device. More specifically, the present invention relates to a nitride-based heterojunction semiconductor device and a method for producing the same.

2. Discussion of the Related Art

In accordance with the recent growth techniques of nitride semiconductors, light emitting diodes and celadon laser diodes that include UV red wavelength bands have been developed and are widely put to use for traffic lights, electronic boards, cellular phones and the like.

Also, gallium nitride (GaN), a representative material for nitride semiconductors, attracts much attraction as a next-generation material for light emitting devices as well as power switching devices such as power MOSFETs, insulated gate bipolar transistors (IGBTs) and high electron mobility transistors (HEMTs) of silicon semiconductors due to high critical voltage and low driving resistance.

SUMMARY OF THE INVENTION

Accordingly, the present invention is directed to a nitride-based heterojunction semiconductor device and a method for producing the same that substantially obviate one or more problems due to limitations and disadvantages of the related art.

It is an object of the present invention to provide a nitride-based heterojunction semiconductor device that has at least one property of low leakage current, high current density, voltage resistance properties and high threshold voltage, and a method for producing the same.

In accordance with one aspect of the present invention, provided is a nitride-based heterojunction semiconductor device comprising: a nitride semiconductor buffer layer; a barrier layer disposed on the buffer layer; a cap layer discontinuously disposed on the barrier layer; a source electrode and a drain electrode that contact at least one of the barrier layer and the cap layer; and a gate electrode contacting at least one of the barrier layer and the cap layer, the gate electrode being disposed between the source electrode and the drain electrode.

In accordance with another aspect of the present invention, provided is a nitride-based heterojunction semiconductor device comprising: a nitride semiconductor buffer layer; a barrier layer disposed on the buffer layer; a cap layer disposed in at least one part of the barrier layer, the cap layer comprising a plurality of unit structures each having a columnar or pyramidal shape that are spaced from one another; a source electrode and a drain electrode that contact at least one of the barrier layer and the cap layer; and a gate electrode contacting at least one of the barrier layer and the cap layer, the gate electrode being disposed between the source electrode and the drain electrode.

In accordance with yet another aspect of the present invention, provided is a method for producing a nitride-based heterojunction semiconductor device, comprising: forming a nitride semiconductor buffer layer on a substrate; forming a barrier layer on the nitride semiconductor buffer layer; forming a cap layer in a discontinuous form on the barrier layer by controlling growth conditions such that the cap layer partially covers the barrier layer; forming a source electrode and a gate electrode that contacts at least one of the barrier layer and the cap layer; and forming a gate electrode that contacts at least one of the barrier layer and the cap layer and is disposed between the source electrode and the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Figure 1:
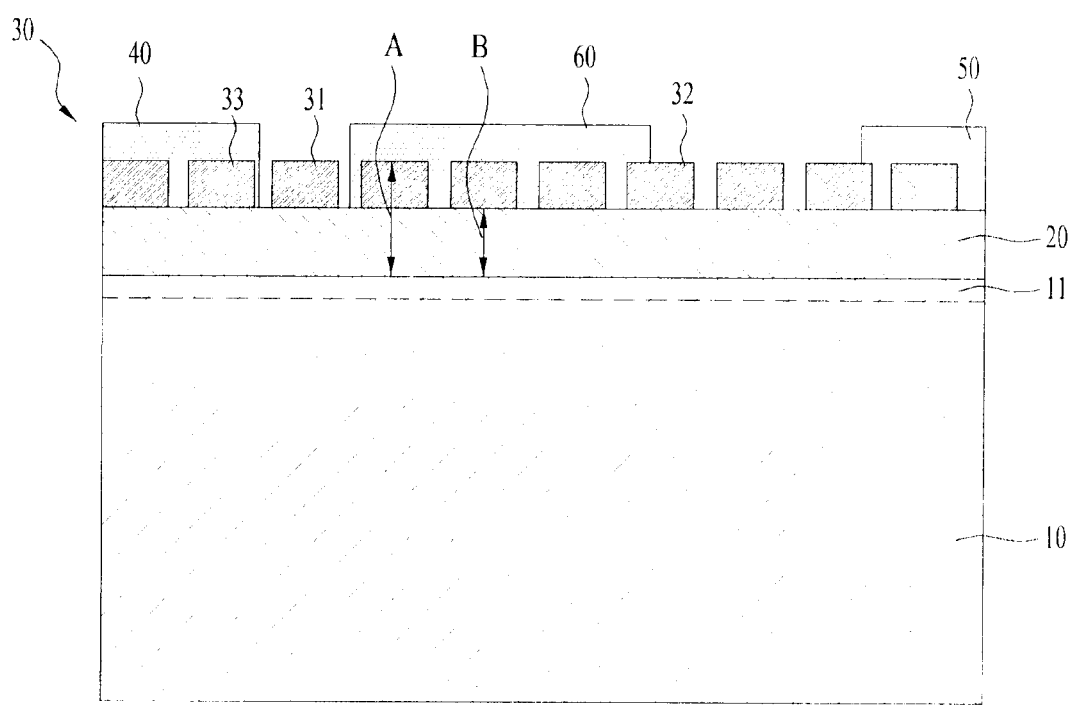
FIG. 1 is a cross-sectional view illustrating an example of a nitride-based heterojunction semiconductor device.

The nitride semiconductor buffer layer 10 may comprise a gallium nitride (GaN) semiconductor, and the barrier layer 20 may comprise an aluminum gallium nitride (AlGaN) material. At this time, the content of the aluminum (Al) in AlGaN may be 10% to 50% of gallium (Ga).

The 2DEG layer 11 is a considerably thin part disposed in a region where the buffer layer 10 contacts the barrier layer 20. The thickness of the 2DEG layer 11 may be about 1 nm. The 2DEG layer 11 forms a narrow and deep channel between the buffer layer 10 and the barrier layer 20, enabling electrons to be moved at a high speed.

A cap layer 30 may be discontinuously disposed on the barrier layer 20. The cap layer 30 may comprise an aluminum nitride (AlN) material.

A source electrode 40 and a drain electrode 50 are disposed on the barrier layer 20 in which the cap layer 30 is discontinuously disposed, and a gate electrode 60 is disposed between the source electrode 40 and the drain electrode 50.

As described above, the cap layer 30 does not cover the entire surface of the barrier layer 20 and is discontinuously disposed. Such a cap layer 30 may be disposed in at least one part of the barrier layer 20 and may comprise a plurality of columns 31, 32 and 33 that are spaced from one another.

The columns that constitute the cap layer 30 may include a column 31 exposed outside, a column 32 partially exposed through the electrode, a column 33 covered by the electrode and the like.

Accordingly, since a region A where the cap layer 30 covers the barrier layer 20 and a region B where the cap layer 30 does not cover the barrier layer 20 are present, the distance from the 2DEG layer 11 to the surface of the semiconductor layer including the cap layer 30 is changed.

Figure 2:
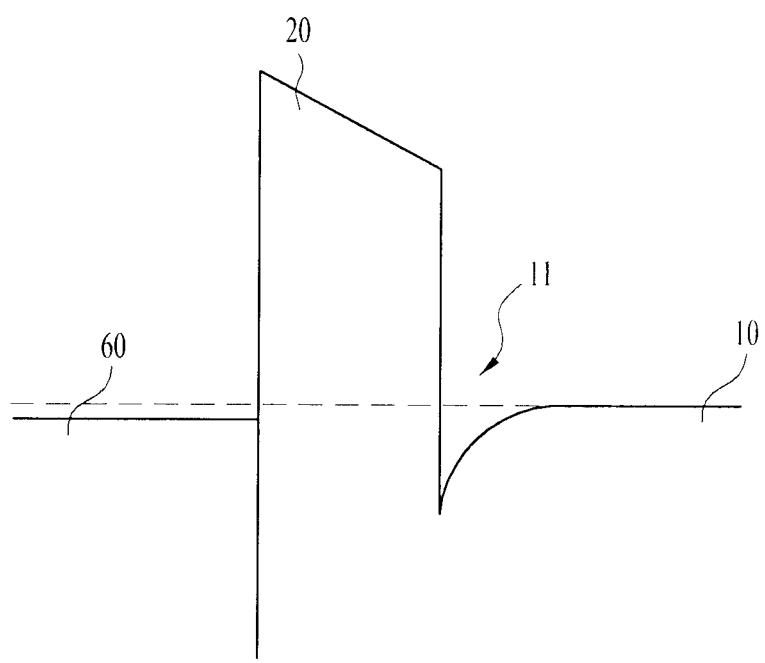
FIG. 2 illustrates an example of an energy band diagram of the gate electrode.

In a case in which such a cap layer 30 is not present, a region, in which the gate electrode 60 is disposed, can exhibit low drain current properties when it has an energy band shown in FIG. 2, a low leakage current and a high voltage resistance. In addition, the gate electrode can exhibit a low threshold voltage when it has a high voltage resistance and current properties.

Also, when the cap layer 30 completely covers the barrier layer 20, the distance between the gate electrode 60 and the 2DEG layer 11, as a channel layer, may be increased and a threshold voltage may be decreased due to increase in carrier concentration of the 2DEG layer 11.

Figure 3:
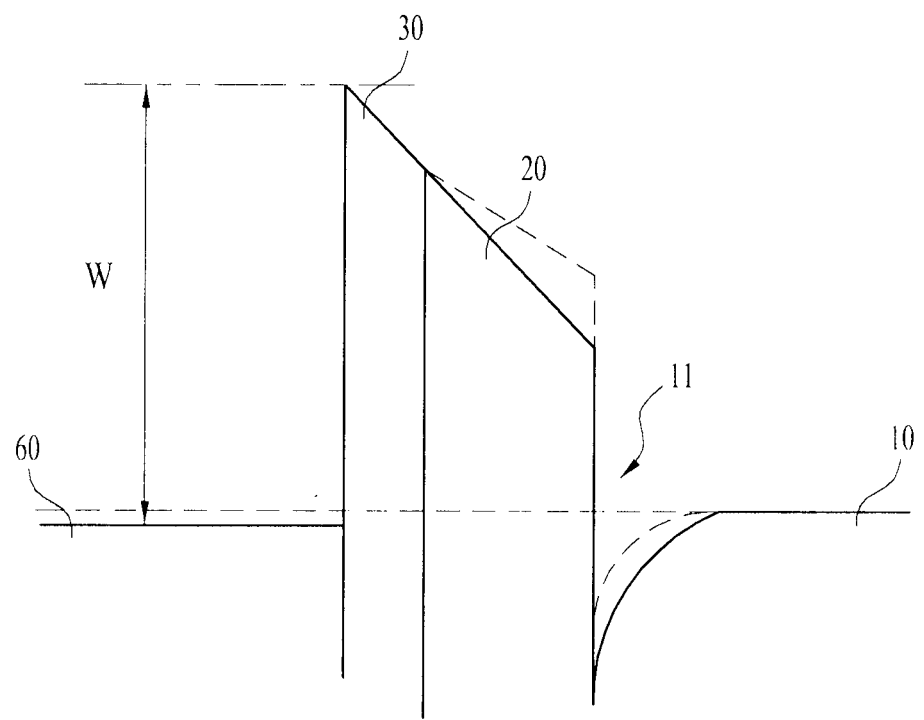
FIG. 3 illustrates another example of an energy band diagram of the gate electrode.

That is, the gate electrode has an energy band as shown in FIG. 3. As described above, the gate electrode 60 may be an electrode material having a high work function (W).

Accordingly, the cap layer 30 discontinuously disposed on the barrier layer 20 can improve the two technical aspects, thus exerting a low leakage current, a high current density and voltage resistance properties, as well as a high threshold voltage, thereby improving properties of power devices.

The columns 31, 32 and 33, unit structures of the cap layer 30 may be regularly or irregularly disposed. However, the density and distribution levels of the columns can be controlled and an area percentage at which the cap layer 30 that covers the barrier layer 20 can thus be controlled.

That is, preferably, the cap layer 30 may be formed such that it covers 1% to 99%, in particular, 30% to 70%, of the area of the barrier layer 20.

Also, the unit structures of the cap layer 30 may be present in the form of a quantum dot.

The thickness distribution of the cap layer 30 may be within a range of 0 nm to 10 nm and is preferably about 0 nm (a part in which the cap layer 30 does not cover the barrier layer 20) to 3 nm. Within this range, the cap layer can exert the desired properties.

The source electrode 40 and the drain electrode 50 may ohmically contact at least one of the barrier layer 20 and the cap layer 30, and may have an electrode structure based on at least one of titanium (Ti) and aluminum (Al).

Also, the gate electrode 60 may Schottky contact at least one of the barrier layer 20 and the cap layer 30 and may have a structure containing at least one of nickel (Ni), iridium (Ir), palladium (Pd), and platinum (Pt).

Hereinafter, a process for producing a nitride-based heterojunction semiconductor device will be described with reference to FIGS. 4 and 5.

First, a substrate (not shown) in which the buffer layer 10 is grown is prepared. As the substrate, any one of sapphire, silicon (Si), silicon carbide (SiC), or gallium nitride (GaN) may be used. GaN may be formed as the buffer layer 10 by metal organic chemical vapor deposition (MOCVD).

The growth using MOCVD may be carried out by synthesizing TMGa as a Ga source and $NH_3$ as an N source in a reactor at a high temperature and growing a thin film on a substrate.

Figure 4:
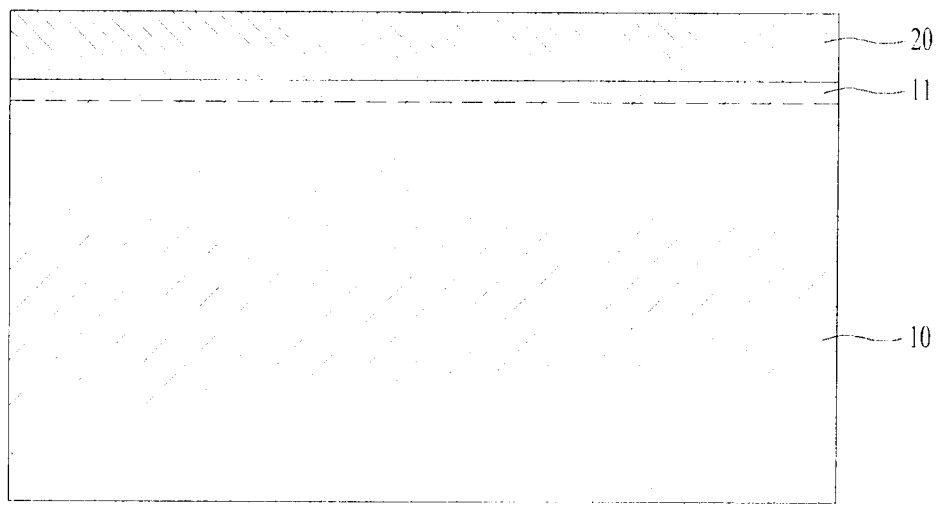
FIGS. 4 and 5 are cross-sectional views illustrating a process for producing a nitride-based heterojunction semiconductor device.

As shown in FIG. 4, a GaN buffer layer 10 is grown to a thickness of 0.5 to 10 μm, preferably, 0.6 to 3 μm on a substrate and an AlGaN barrier layer 20 for formation of the 2DEG layer 11 is grown thereon.

As described above, the content of aluminum (Al) in AlGaN grown is 10 to 50% of the content of gallium (Ga). At this time, the barrier layer 20 is grown to a thickness of 100 nm or less, more preferably about 0 to 20 nm.

Figure 5:
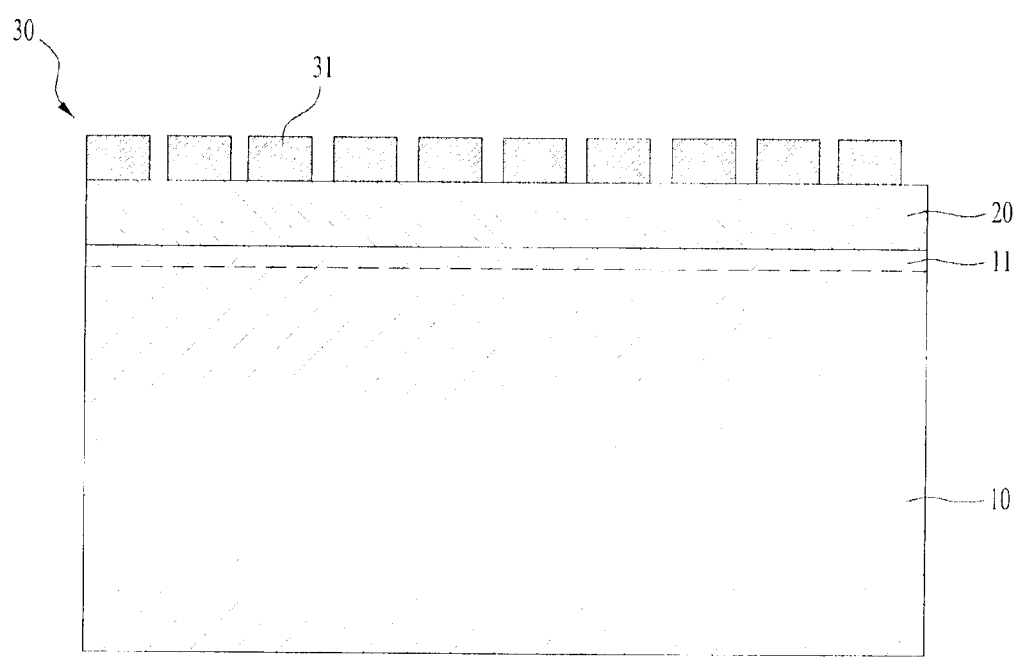

Next, as shown in FIG. 5, discontinuous AlN columns used for the cap layer 30 are grown on the barrier layer 20. The cap layer 30 may have a quantum dot shape and may contain the all discontinuous AlN columns that do not completely cover the surface of the barrier layer 20.

MOCVD can control growth rate, control a thickness on a nanometer scale, and control a growth direction according to pressure, temperature, source gas flow or the like, thus being suitable for growth of the cap layer 30 that covers the barrier layer 20 at a predetermined ratio.

Accordingly, the cap layer 30 may be formed without using a separate mask layer such that it covers the barrier layer 20 at a desired area ratio.

Figure 6:
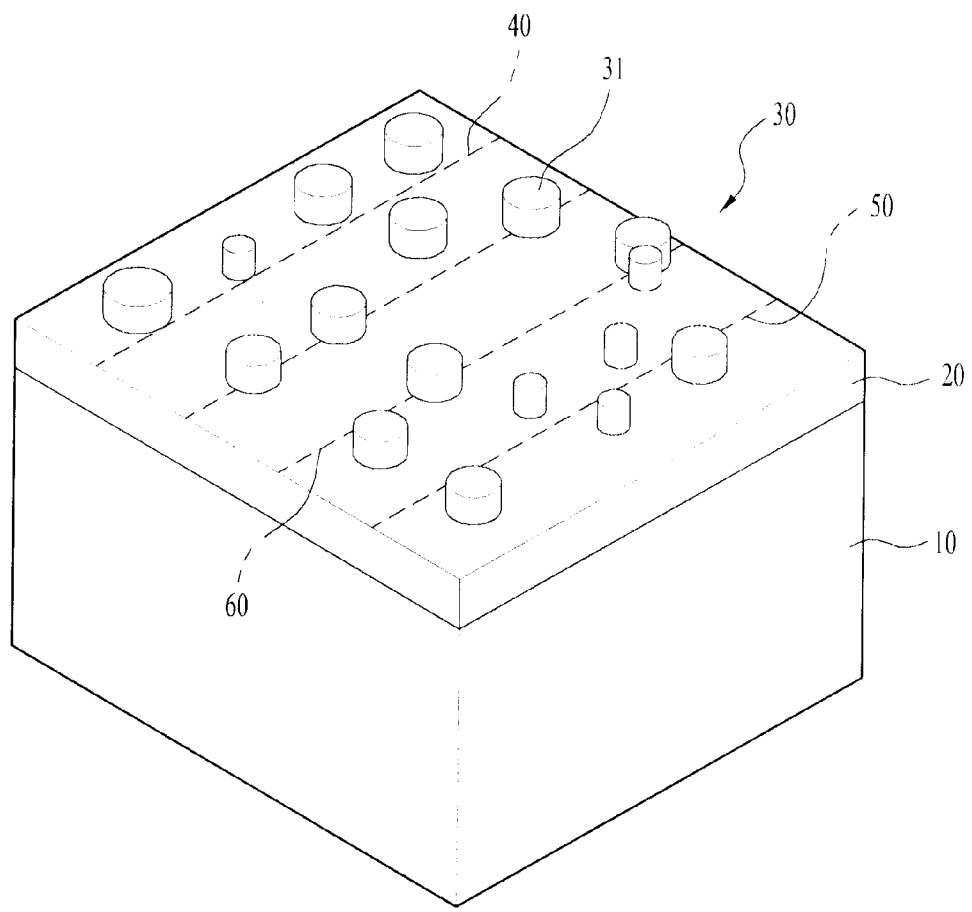
FIG. 6 is a perspective view illustrating a state in which a cap layer is formed.

The cap layer 30 may be formed as shown in FIG. 6, such that AlN columns 31 are irregularly disposed or overlap one another in some regions.

Also, the columns 31 may have form a hexagonal column or hexagonal pyramid shape depending on the crystalline structure of GaN. In some cases, the columns 31 may have different sizes. In FIG. 6, the thickness of the columns 31 may be slightly exaggerated.

The source electrode 40, the drain electrode 50 and the gate electrode 60 may be disposed in a direction represented by dotted lines.

That is, after the cap layer 30 is grown, the source electrode 40, the drain electrode 50 and the gate electrode 60 are formed to complete the structure shown in FIG. 1.

As described above, the source electrode 40 and the drain electrode 50 use a Ti/Al-based structure as an ohmic contact material which may be subjected to heat-treatment or may be used without heat-treatment.

Also, the gate electrode 60 may be formed using at least one electrode material having a high work function such as Ni, Ir, Pd and Pt.

According to such a nitride-based heterojunction semiconductor device, since a device structure can be produced only through growth of semiconductor thin film, a separate process for adjusting a threshold voltage is unnecessary and leakage current generated thereby can thus be reduced.

Also, due to high voltage resistance properties and high 2DEG channel concentration of the cap layer 30, current properties and voltage resistance properties, the most important properties of the power device, can be improved and driving voltage can be easily controlled.

The structure of the device or variations thereof may be applied to devices such as power MOSFETs or insulated gate bipolar transistors (IGBTs) and high electron mobility transistors (HEMTs).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A nitride-based heterojunction semiconductor device comprising:
    a nitride semiconductor buffer layer;
    a barrier layer disposed on the buffer layer;
    a cap layer discontinuously disposed on the barrier layer, wherein the cap layer comprises a plurality of unit structures that are spaced from one another;
    a source electrode and a drain electrode that contact the barrier layer and the cap layer; and
    a gate electrode contacting the barrier layer and the cap layer, the gate electrode being disposed between the source electrode and the drain electrode.

2. The semiconductor device according to claim 1, wherein the cap layer comprises an AlN layer.

3. The semiconductor device according to claim 1, wherein the cap layer is irregularly disposed on the barrier layer.

4. The semiconductor device according to claim 1, wherein the cap layer is in the form of a quantum dot.

5. The semiconductor device according to claim 1, wherein the unit structures have a columnar or pyramidal shape.

6. The semiconductor device according to claim 1, wherein the unit structures have a hexagonal column or hexagonal pyramid shape.

7. The semiconductor device according to claim 1, wherein the cap layer covers 30% to 70% of the area of the barrier layer.

8. The semiconductor device according to claim 1, wherein the cap layer has a thickness distribution of 0 nm to 3 nm.

9. A nitride-based heterojunction semiconductor device comprising:
a nitride semiconductor buffer layer;
a barrier layer disposed on the buffer layer;
a cap layer disposed in at least one part of the barrier layer, the cap layer comprising a plurality of unit structures that are spaced from one another;
a source electrode and a drain electrode that contact the barrier layer and the cap layer such that at least one of the source electrode and the drain electrode covers at least one unit structure of the cap layer; and
a gate electrode contacting the barrier layer and the cap layer, the gate electrode being disposed between the source electrode and the drain electrode.

10. The semiconductor device according to claim 9, wherein the cap layer comprises an AlN layer.

11. The semiconductor device according to claim 9, wherein the unit structures having a columnar or pyramidal shape are irregularly disposed on the barrier layer.

12. The semiconductor device according to claim 9, wherein the unit structures having a columnar or pyramidal shape are in the form of a quantum dot.

13. The semiconductor device according to claim 9, wherein the cap layer covers 30% to 70% of the area of the barrier layer.

14. The semiconductor device according to claim 9, wherein the cap layer has a thickness distribution of 0 nm to 3 nm.

15. The semiconductor device according to claim 9, wherein the unit structures have a hexagonal columnar or pyramidal shape.

16. A method for producing a nitride-based heterojunction semiconductor device, comprising:
forming a nitride semiconductor buffer layer on a substrate;
forming a barrier layer on the nitride semiconductor buffer layer;
forming a cap layer in a discontinuous form on the barrier layer by controlling growth conditions such that the cap layer partially covers the barrier layer, wherein the cap layer comprises a plurality of unit structures that are spaced from one another;
forming a source electrode and a drain electrode that contacts the barrier layer and the cap layer such that at least one of the source electrode and the drain electrode covers at least one unit structure of the cap layer; and
forming a gate electrode that contacts the barrier layer and the cap layer and is disposed between the source electrode and the drain electrode.

17. The method according to claim 16, wherein the cap layer covers 30% to 70% of the entire area of the barrier layer.

18. The method according to claim 16, wherein the cap layer comprises an AlN layer.

19. The method according to claim 16, wherein the unit structures have a columnar or pyramidal shape.

20. The method according to claim 16, wherein the unit structures having a columnar or pyramidal shape are irregularly disposed on the barrier layer.

21. The semiconductor device according to claim 1, wherein at least one of the source electrode, the drain electrode and the gate electrode covers at least one unit structure of the cap layer.

22. A nitride-based heterojunction semiconductor device comprising:
a nitride semiconductor buffer layer;
a barrier layer disposed on the buffer layer;
a cap layer discontinuously disposed on the barrier layer, wherein the cap layer is in the form of a quantum dot;
a source electrode and a drain electrode that contact at least one of the barrier layer and the cap layer; and
a gate electrode contacting at least one of the barrier layer and the cap layer, the gate electrode being disposed between the source electrode and the drain electrode.

* * * * *